(12) United States Patent
Cheong

(10) Patent No.: US 8,563,997 B2
(45) Date of Patent: Oct. 22, 2013

(54) SEMICONDUCTOR LIGHT EMITTING DEVICE

(75) Inventor: Hung Seob Cheong, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/572,896

(22) Filed: Aug. 13, 2012

(65) Prior Publication Data

US 2012/0305974 A1    Dec. 6, 2012

Related U.S. Application Data

(63) Continuation of application No. 12/434,318, filed on May 1, 2009, now Pat. No. 8,263,989.

(30) Foreign Application Priority Data

May 2, 2008  (KR) .......................... 10-2008-0041200

(51) Int. Cl.
   *H01L 33/00* (2010.01)
(52) U.S. Cl.
   USPC .................. 257/97; 257/94; 257/96; 257/98; 257/103; 257/E33.023; 257/E33.069
(58) Field of Classification Search
   USPC ......................................... 257/94, 96–98, 103
   See application file for complete search history.

(56) References Cited

U.S. PATENT DOCUMENTS

| | | | |
|---|---|---|---|
| 6,015,979 A | 1/2000 | Sugiura et al. | |
| 6,091,083 A | 7/2000 | Hata et al. | |
| 6,111,277 A | 8/2000 | Ikeda | |
| 6,228,181 B1 | 5/2001 | Yamamoto et al. | |
| 6,316,785 B1 | 11/2001 | Nunoue et al. | |
| 2002/0014629 A1 | 2/2002 | Shibata et al. | |
| 2003/0006211 A1* | 1/2003 | Fukunaga et al. | 216/2 |
| 2003/0048818 A1 | 3/2003 | Takeuchi et al. | |
| 2003/0085411 A1 | 5/2003 | Shibata et al. | |
| 2003/0143771 A1 | 7/2003 | Kidoguchi et al. | |
| 2004/0041156 A1* | 3/2004 | Tsuda et al. | 257/79 |
| 2004/0113166 A1 | 6/2004 | Tadatomo et al. | |
| 2004/0119084 A1 | 6/2004 | Hsieh et al. | |
| 2005/0167686 A1 | 8/2005 | Seo | |
| 2005/0224816 A1 | 10/2005 | Kim et al. | |
| 2006/0006408 A1 | 1/2006 | Suehiro et al. | |
| 2006/0118803 A1* | 6/2006 | Lee et al. | 257/98 |
| 2006/0237735 A1 | 10/2006 | Naulin et al. | |
| 2006/0252166 A1* | 11/2006 | Seo | 438/22 |
| 2006/0289883 A1 | 12/2006 | Kim et al. | |
| 2007/0069222 A1 | 3/2007 | Ko et al. | |
| 2007/0241352 A1* | 10/2007 | Yasuda et al. | 257/94 |
| 2007/0246700 A1 | 10/2007 | Park | |
| 2008/0006838 A1 | 1/2008 | Hattori et al. | |

(Continued)

FOREIGN PATENT DOCUMENTS

| | | |
|---|---|---|
| JP | 11-238689 A | 8/1999 |
| JP | 2005-347700 A | 12/2005 |

(Continued)

*Primary Examiner* — A. Sefer
(74) *Attorney, Agent, or Firm* — Birch, Stewart, Kolasch & Birch, LLP

(57) ABSTRACT

A semiconductor light emitting device comprises a first nitride semiconductor layer comprising a flat top surface and a plurality of concave regions from the flat top surface, a reflector within the concave regions of the first semiconductor layer, and a second semiconductor layer on the first semiconductor layer.

20 Claims, 12 Drawing Sheets

(56) References Cited

U.S. PATENT DOCUMENTS

| | | |
|---|---|---|
| 2008/0105881 A1 | 5/2008 | Kim et al. |
| 2008/0169482 A1 | 7/2008 | Kang |
| 2008/0308835 A1 | 12/2008 | Pan |
| 2009/0072262 A1 | 3/2009 | Iza et al. |
| 2009/0114930 A1 | 5/2009 | Kuo |
| 2010/0015739 A1 | 1/2010 | Park |
| 2010/0163912 A1* | 7/2010 | Lee et al. .................. 257/98 |
| 2011/0212559 A1 | 9/2011 | Ohmae et al. |

FOREIGN PATENT DOCUMENTS

| | | |
|---|---|---|
| JP | 2008-016556 A | 1/2008 |
| KR | 10-2005-0097076 A | 10/2005 |
| KR | 10-2009-0010569 A | 1/2009 |
| KR | 10-2009-0016051 A | 2/2009 |

* cited by examiner

SEMICONDUCTOR LIGHT EMITTING DEVICE

CROSS-REFERENCE TO RELATED APPLICATIONS

This application is a Continuation of U.S. patent application Ser. No. 12/434,318, filed on May 1, 2009, now U.S. Pat. No. 8,263,989 and claims priority under 35 U.S.C. 119 to Korean Patent Application No. 10-2008-0041200 (filed on May 2, 2008), which is hereby incorporated by reference in its entirety.

BACKGROUND

The present disclosure relates to a semiconductor light emitting device.

Group III-V nitride semiconductors have been variously applied to an optical device such as blue and green Light Emitting Diodes (LED), a high speed switching device such as a Metal Oxide Semiconductor Field Effect Transistor (MOSFET), a High Electron Mobility Transistor (HEMT) and a Hetero junction Field Effect Transistor (HFET), and a light source of a lighting device or a display device.

The nitride semiconductor is mainly used for an LED or a Laser Diode (LD), and studies have been continuously conducted to improve the manufacturing process or light efficiency of the nitride semiconductor.

SUMMARY

Embodiments provide a semiconductor light emitting device which comprises a reflector having a cavity in at least one portion of a semiconductor layer.

Embodiments provide a semiconductor light emitting device which comprises a plurality of concave portions and reflectors having an inverse horn shape between a plurality of semiconductor layers.

Embodiments provide a semiconductor light emitting device which comprises discontinuous reflectors having a single-layer or multi-layer structure between a plurality of semiconductor layers.

Embodiments provide a semiconductor light emitting device comprising a plurality of reflectors and cavities which are disposed in a nitride semiconductor layer under a light emitting structure.

An embodiment provides a semiconductor light emitting device comprising: a first semiconductor layer comprising a flat top surface and a plurality of concaves; a reflector within at least one of the plurality of concaves of the first semiconductor layer; a second semiconductor layer on the first semiconductor layer; a third semiconductor layer on the second semiconductor layer; and an active layer between the second semiconductor layer and the third semiconductor layer, wherein the reflector has a different material from the first semiconductor layer and the second semiconductor layer, wherein the flat top surface of the first semiconductor layer is physically contacted with a lower surface of the second semiconductor layer and is disposed between the plurality of concaves, wherein the plurality of concaves are spaced apart from each other and have an interval from a lower surface of the first semiconductor layer.

An embodiment provides a semiconductor light emitting device comprising: a first semiconductor layer comprising a flat top surface and a plurality of concaves; a second semiconductor layer disposed on the first semiconductor layer and including a first conductive type dopant; a reflector within the plurality of concaves; a first electrode connected to the second semiconductor layer; a third semiconductor layer disposed on the second semiconductor layer and including a second conductive type dopant; an active layer between the second semiconductor layer and the third semiconductor layer; an electrode layer on the third semiconductor layer, wherein the reflector has a different material from the first semiconductor layer and the second semiconductor layer, wherein the reflector is disposed between the first semiconductor layer and the second semiconductor layer, and wherein the flat top surface of the first semiconductor layer is disposed between the plurality of concaves.

An embodiment provides a semiconductor light emitting device comprises: a first semiconductor layer comprising a flat top surface region and a concave regions; a reflector within the concave regions of the first semiconductor layer; a second semiconductor layer on the first semiconductor layer; a third semiconductor layer on the second semiconductor layer; and an active layer between the second semiconductor layer and the third semiconductor layer, wherein the reflector has a different material from the first semiconductor layer and the second semiconductor layer, wherein the flat top surface region of the first semiconductor layer is disposed under a lower surface of the second semiconductor layer, wherein the concave region has at least two concaves and a position of the concaves is positioned less high than the flat top surface region from a lower surface of the first semiconductor layer.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings. In description of embodiments, each element will be described as an example and is not limited to the size of the accompanying drawings.

Figure 1:
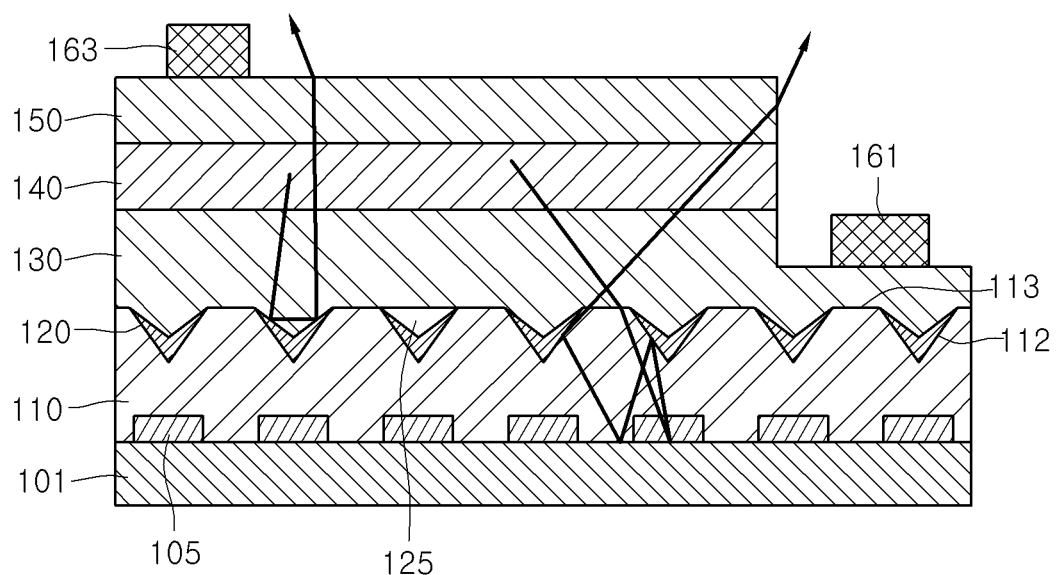
FIG. 1 is a side-sectional view of a semiconductor light emitting device according to a first embodiment.

FIG. 1 is a side-sectional view of a semiconductor light emitting device according to a first embodiment.

Referring to FIG. 1, a semiconductor light emitting device 100 according to the first embodiment comprises a substrate 101, a nitride semiconductor layer 110, a plurality of reflectors 120, a first conductive semiconductor layer 130, an active layer 140, a second conductive semiconductor layer 150, a first electrode 161, and a second electrode 163.

The semiconductor light emitting device 100 comprises a light emitting diode (LED) based on group III-V compound semiconductors, and the LED may comprise a color LED emitting blue light, green light or red light or an UV LED. The light emitted from the LED may be variously realized within the technical scope of the embodiment.

The substrate 101 may be formed of at least one of sapphire substrate ($Al_2O_3$), GaN, SiC, ZnO, Si, GaP and GaAs.

An island pattern 105 is formed on the substrate 101. The island pattern 105 has an island shape, regular pattern or irregular pattern, and may be formed at regular intervals or irregular intervals.

The pattern may be formed in a shape of regular shape or irregular shape by using a photomask material, or may be formed in the island shape by using the thin film of a compound semiconductor.

The pattern may be formed by selectively using photomask materials such as $SiO_2$, $SiO_x$, $SiN_x$, $SiO_xN_y$, and metal materials, or may be formed of at least one of compound semiconductor materials such as GaN, InN, AlN, InGaN, AlGaN and InAlGaN. However, the materials may be changed in the spirit and scope of embodiments.

A buffer layer or/and an undoped semiconductor layer may be formed on the substrate. The buffer layer or/and the undoped semiconductor layer comprises a group III-V compound semiconductor. The pattern may be formed on the buffer layer or the undoped semiconductor layer.

The nitride semiconductor layer 110 having a certain thickness is formed on the substrate 101.

The nitride semiconductor layer 110 may be formed to have a thickness thicker than that of the island pattern 105.

The nitride semiconductor layer 110 comprises a group III-V compound semiconductor, for example, may be selected from the group consisting of GaN, InN, AlN, InGaN, AlGaN and InAlGaN. The nitride semiconductor layer 110 may be a semiconductor layer on which a conductive dopant is doped or an undoped semiconductor layer on which the conductive dopant is not doped.

The upper portion of the nitride semiconductor layer 110 comprises a plurality of concave portions 112 and convex portions 113. The concave portions 112 are formed in a position corresponding to the island pattern 105. The convex portions 113 are formed in a flat plane at regions other than the concave portions 112.

The concave portion 112 of the nitride semiconductor layer 110 may be formed in at least one of an inverse pyramid shape, an inverse multi-angle horn shape, an inverse cone shape and an inverse multi-angle truncated-horn shape. Moreover, at least one side of the concave portion 112 may be slopingly formed. In embodiments, the shape of the concave portion 112 will exemplify an inverse horn shape as an example. However, such a shape may be modified in the spirit and scope of embodiments.

The concave portions 112 of the nitride semiconductor layer 110 may be formed in a conformal or non-conformal shape, but is not limited thereto.

The reflector 120 is formed on the concave portion 112 of the nitride semiconductor layer 110. The reflector 120 may be formed on a concave-convex shape or a rough shape. For example, the reflector 120 is formed along the shape of the concave portion 112, and has a structure where a concave groove is formed in its inside.

The reflector 120 may be formed of at least one of the reflection material group consisting of $SiO_2$, $SiO_x$, $SiN_2$, $SiN_x$, $SiO_xN_y$ or metal materials (for example, tungsten). The reflector 120 may be formed of at least one of the semiconductor group consisting of GaN, InN, AlN, InGaN, AlGaN or InAlGaN and the reflection material group. The reflector 120 may be formed in a single layer or multi layers by using the materials.

The first conductive semiconductor layer 130 is formed on the nitride semiconductor layer 110. The first conductive semiconductor layer 130 may be formed of at least one of the compound semiconductors of group III-V elements (on which a first conductive dopant is doped), for example, GaN, AlN, AlGaN, InGaN, InN, InAlGaN and AlInN. In a case where the first conductive semiconductor layer 130 is an N-type semiconductor layer, the first conductive dopant comprises an N-type dopant such as Si, Ge, Sn, Se and Te. The first conductive semiconductor layer 130 may serve as an electrode contact layer, but is not limited thereto.

The first conductive semiconductor layer 130 may be formed of the same semiconductor material as or a semiconductor material different from that of the nitride semiconductor layer 120. Herein, in a case where the nitride semiconductor layer 120 comprises a first conductive dopant, it may be composed of a semiconductor having the first conductive dopant.

The sealed cavity 125 may be formed in at least one of the reflectors 120. The cavity 125 may be formed in a certain shape between the reflector 120 and the first conductive semiconductor layer 130. The cavity 125 may be formed in an inverse pyramid shape, an inverse polyhedron shape, an inverse horn shape or a plurality of irregular shapes at the inside of the inverse horn shape of the reflector 120. The width or diameter of the cavity 125 is about 0.01 um to 10 um, and its depth is about 0.01 um to 10 um.

The active layer 140 is formed on the first conductive semiconductor layer 130, and the active layer 140 may be formed in a single quantum well structure or a multiple quantum well structure.

The active layer 140 may form the period of a well layer and a barrier layer, for example, the period of an InGaN well layer/GaN barrier layer or the period of an AlGaN well layer/GaN barrier layer by using the compound semiconductor material of group III and group V elements. The active layer 140 may be formed of a material having a bandgap energy according to the wavelength of an emitting light. The active layer 140 may comprise a material that emits a chromatic light such as a light having a blue wavelength, a light having a red wavelength and a light having a green wavelength.

A conductive clad layer may be formed on and/or under the active layer 140, and the conductive clad layer may be formed of an AlGaN-based semiconductor.

At least one second conductive semiconductor layer 150 is formed on the active layer 140, and the second conductive semiconductor layer 150 may be formed of at least one of the compound semiconductors of group III-V elements (on which a second conductive dopant is doped), for example, GaN, AlN, AlGaN, InGaN, InN, InAlGaN and AlInN. In a case where the second conductive semiconductor layer 150 is a P-type semiconductor layer, the second conductive dopant may comprise a P-type dopant such as Mg and Ze. The second conductive semiconductor layer 150 may serve as an electrode contact layer, but is not limited thereto.

Herein, the first conductive semiconductor layer 130, the active layer 140 and the second conductive semiconductor layer 150 may be defined as a light emitting structure. The first conductive semiconductor layer 130 may be formed of a P-type semiconductor layer, and the second conductive semiconductor layer 150 may be formed of an N-type semiconductor layer. Moreover, a third conductive semiconductor layer, for example, an N-type semiconductor or a P-type semiconductor, may be formed on the second conductive semiconductor layer 150. Accordingly, the light emitting structure may comprise at least one of an N-P junction structure, a P-N junction structure, an N-P-N junction structure and a P-N-P junction structure.

A first electrode is formed on the first conductive semiconductor layer 130, and a second electrode 163 is formed on the second conductive semiconductor layer 150.

An electrode layer (not shown), for example, a transparent electrode layer or a reflection electrode layer may be formed on the second conductive semiconductor layer 150. The second electrode 163 may electrically contact the electrode layer or/and the second conductive semiconductor layer. The transparent electrode layer may be formed of at least one of ITO, ZnO, RuOx, TiOx and IrOx, and the reflection electrode layer may be formed of at least one of Al, Ag, Pd, Rh, Pt and Ir.

In the semiconductor light emitting device 100, when a power supply source is applied through the first electrode 161 and the second electrode 163, light which is radiated by the active layer 140 is radiated in a forward direction. At this point, light traveling to the reflector 120 is reflected, refracted and diffused by the reflector 120, thereby changing the critical angle of the light. Moreover, the light may be reflected or refracted by the medium difference between the reflector 120, the cavity 125 and the first conductive semiconductor layer 130. Accordingly, the semiconductor light emitting device 100 decreases the total reflection rate of light in the inside of a device, thereby improving light extraction efficiency.

FIGS. 2 to 13 are diagrams illustrating a process of manufacturing the semiconductor light emitting device in FIG. 1.

Figure 2:
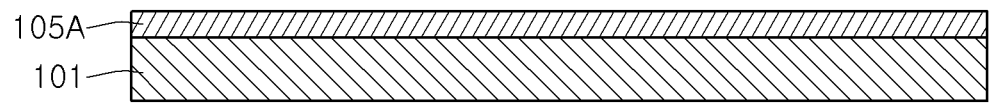
FIGS. 2 to 13 are diagrams illustrating a process of manufacturing the semiconductor light emitting device in FIG. 1.
Figure 3:
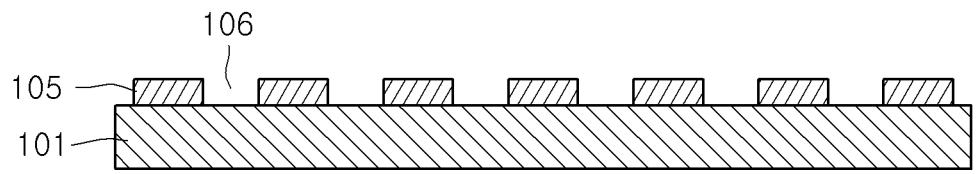

Referring to FIGS. 2 and 3, a mask layer 105A is formed on the substrate 101. The substrate 101 may be formed of at least one of sapphire substrate ($Al_2O_3$), GaN, SiC, ZnO, Si, GaP and GaAs.

The mask layer 105A may be selected from the group consisting of $SiO_2$, $SiO_x$, $SiN_2$, $SiN_x$ and $SiO_xN_y$. The mask layer 105A is deposited in Plasma Enhanced Chemical Vapor Deposition (PECVD) or sputtering.

The mask layer 105A may be formed by selectively using photomask materials such as $SiO_2$, $SiO_x$, $SiN_x$, $SiO_xN_y$ and metal materials, or may be formed of at least one of compound semiconductor materials such as GaN, InN, AlN, InGaN, AlGaN and InAlGaN. However, the materials may be changed in the spirit and scope of embodiments.

The mask layer 105A may be formed in the island pattern 105 having a window 106 by an etching process using a certain mask pattern. In the island pattern 105, an island having a circle or polygon shape may be formed at regular intervals or irregular intervals. Such an island shape and pattern may be modified in the spirit and scope of embodiments.

In a case where a buffer layer (not shown) or/and an undoped semiconductor layer (not shown) is formed on the substrate 101, the mask layer 105A may be formed on the buffer layer or the undoped semiconductor layer. The buffer layer may be implemented with a group III-V compound semiconductor for decreasing a lattice constant with respect to the substrate 101. The undoped semiconductor layer may be implemented with an undoped GaN-based semiconductor.

Figure 4:
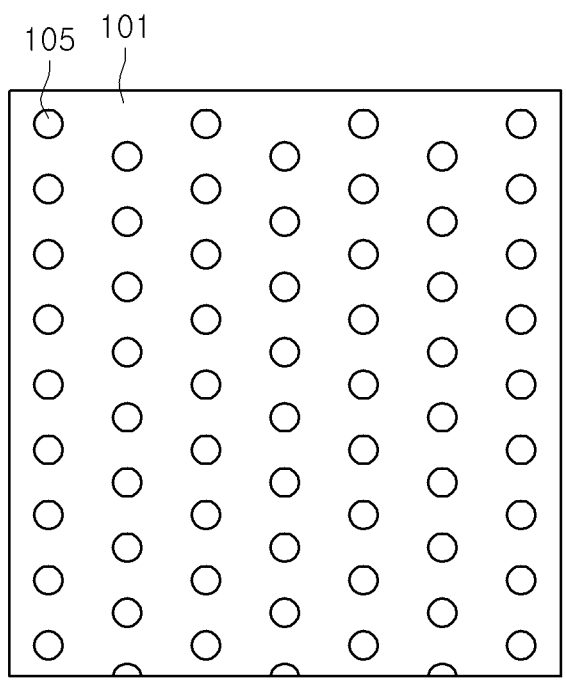

FIG. 4 is a diagram illustrating the plan view of FIG. 2. The island pattern 105 is formed in a zigzag shape on the substrate 101.

Figure 5:
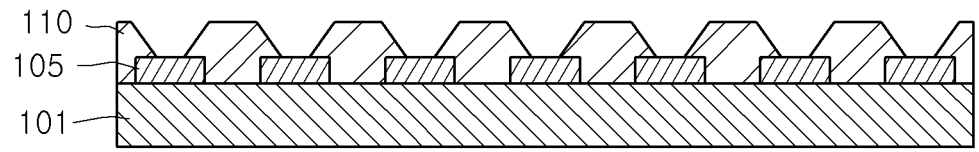
Figure 6:
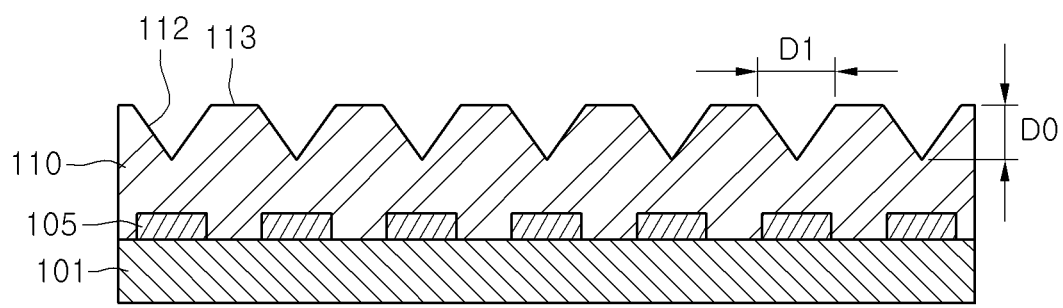

Referring to FIGS. 5 and 6, the nitride semiconductor layer 110 is formed on the substrate 101 and the island pattern 105.

A nitride semiconductor grows on the substrate 101, and may grow by growth equipment such as electron beam evaporator, Physical Vapor Deposition (PVD), Chemical Vapor Deposition (CVD), Plasma Laser Deposition (PLD), dual-type thermal evaporator, sputtering and Metal Organic Chemical Vapor Deposition (MOCVD), but is not limited thereto.

When the nitride semiconductor layer 110 is GaN, it may be formed in CVD (or MOCVD). For example, the nitride semiconductor layer 110 may use a group-III gas such as trimethyl gallium (TMGa) or triethyl gallium (TEGa) as a source gas for Ga, and may use a group-V gas such as ammonia ($NH_3$), monomethyl hydrazine (MMHy) or dimethyl hydrazine (DMHy) as a source gas for N.

By controlling growth conditions such as a growth temperature, a group-V gas to group-III gas ratio and a growth pressure, the nitride semiconductor layer 110 may grow. In this case, the nitride semiconductor layer 110 grows from the top of the substrate 101 at the initial stage of growth. As a growth time elapses, the nitride semiconductor layer 110 grows to the top of the island pattern 105. At this point, the nitride semiconductor layer 110 may be sutured or may not be sutured on the island pattern 105, but is not limited thereto.

A region corresponding to the island pattern 105 is the concave portion 112 of the nitride semiconductor layer 110, and a region other than the concave portion 112 is the convex portion 113 of the nitride semiconductor layer 110.

The nitride semiconductor layer 110 may be selected from the group consisting of GaN, InN, AlN, InGaN, AlGaN and InAlGaN. Moreover, the nitride semiconductor layer 110 may be implemented with a semiconductor layer on which a conductive dopant is doped or not. The concave portion 112 of the nitride semiconductor layer 110 may be formed in an inverse horn shape such as an inverse pyramid shape, an inverse multi-angle horn shape and an inverse cone shape. For example, the concave portion 112 of the nitride semiconductor layer 110 may be formed in the inverse pyramid shape by the crystallinity of a GaN-based semiconductor.

In the concave portion 112 of the nitride semiconductor layer 110, its diameter D1 and depth D0 may be formed by semiconductor crystallization, or may be formed in consideration of the size of the reflector 120. The concave portions 112 of the nitride semiconductor layer 110 may be formed at constant intervals and of a conformal size, or may be formed at irregular intervals and of a random size.

Herein, the concave portion 112 of the nitride semiconductor layer 110 may be formed without forming the island pattern 105, but may be modified in the spirit and scope of embodiments.

Figure 7:
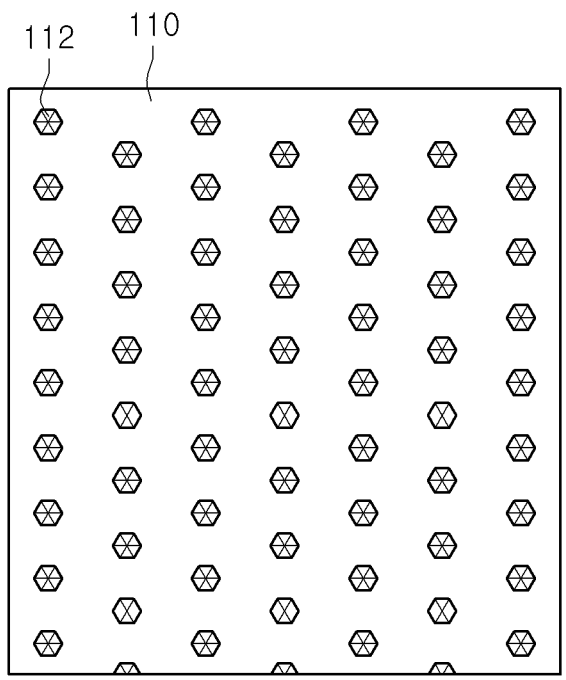

FIG. 7 is a plan view of FIG. 6. The concave portion 112 of the nitride semiconductor layer 110 may be formed in an inverse multi-angle horn shape at a position corresponding to the island pattern of FIG. 4.

Figure 8:
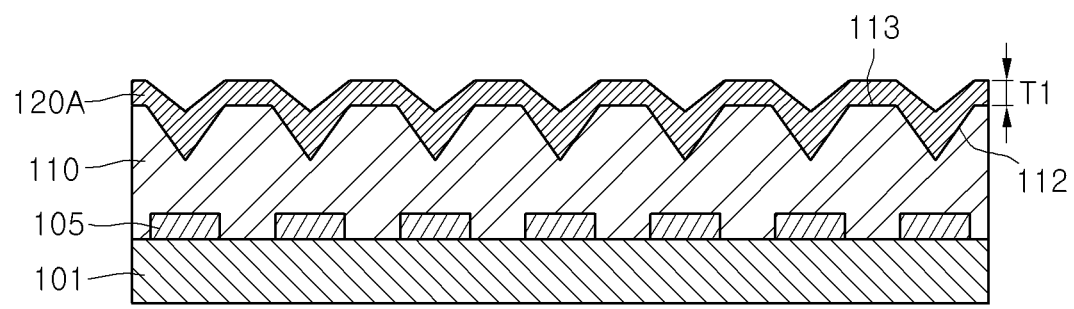

Referring to FIGS. 7 and 8, a reflector layer 120A is formed on the nitride semiconductor layer 110. The reflector layer 120A may be formed in a single layer or multi layers. The reflector layer 120A may be formed of at least one of the reflection material group consisting of $SiO_2$, $SiO_x$, $SiN_2$, $SiN_x$, $SiO_xN_y$ or metal materials (for example, tungsten). The reflector layer 120A may be formed in two or more layers by selectively using the semiconductor group consisting of GaN, InN, AlN, InGaN, AlGaN or InAlGaN and the reflection material group.

The reflector layer 120A may be formed to a certain thickness T1 from the top of the nitride semiconductor layer 110.

The surface of the reflector layer 120A may be formed in a concave-convex shape, and the concave shape may be formed in a shape corresponding to the concave portion 112 of the nitride semiconductor layer 110.

Figure 9:
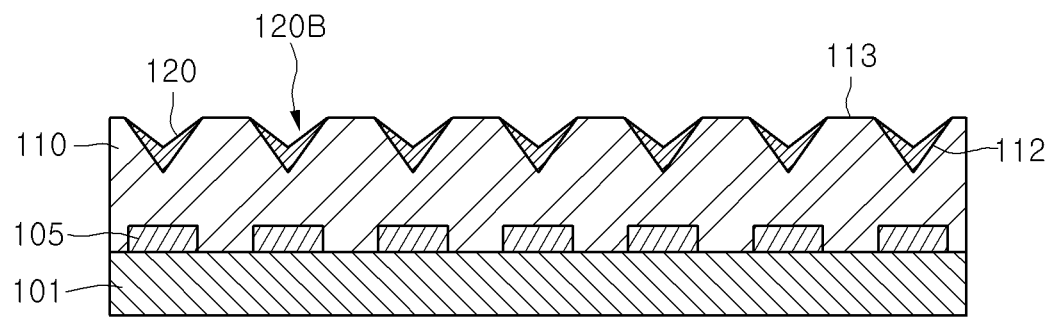

Referring to FIGS. 8 and 9, the certain thickness T1 of the reflector layer 120A is removed. The reflector layer 120A is removed until the convex portion 113 of the nitride semiconductor layer 110 is exposed. The removing process is performed in a polishing process, a selective etching process or an etching process next to the polishing process. If the reflector layer 120A is polished to the certain thickness T1, as illustrated in FIG. 8, a plurality of reflectors 120 exist in the concave portions 112 of the nitride semiconductor layer 110, respectively. The plurality of reflectors 120 may be discontinuously arranged.

The reflector 120 may be formed in a concave-convex shape by the concave shape of the reflector layer 120A. That is, the reflector 120 has an inverse multi-angle horn shape, and a groove 120B having a concave shape may be formed in the inside of the reflector 120.

Herein, the upper side of the nitride semiconductor layer 110 is composed of the concave portions 112 and the convex portions 113. The each concave portion 112 is formed in such a form that it accommodates the each reflector 120. The plurality of reflectors 120 are spaced apart, and are disposed in a position corresponding to the island pattern 105.

Moreover, the size and shape of the reflector 120 is determined by the concave shape of the nitride semiconductor layer 110, or may be modified according to a polishing or etching rate. The size and shape of the reflector 120 may be modified in the spirit and scope of embodiments.

Figure 10:
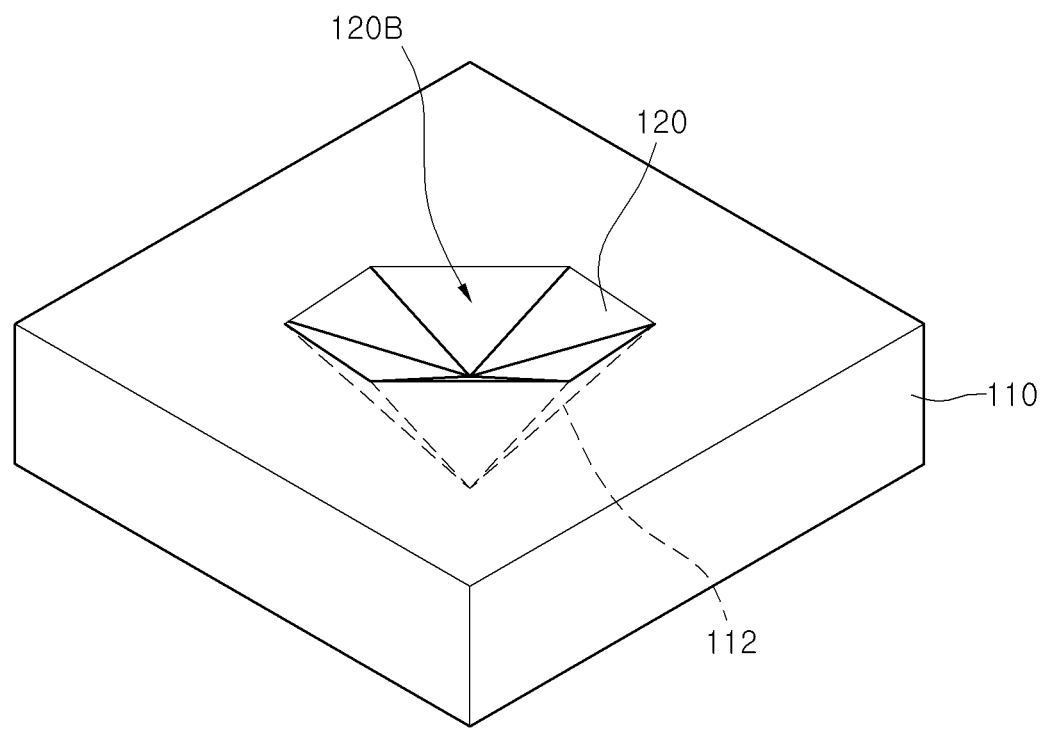

Referring to FIG. 10, the reflector 120 which is formed on the concave portion 112 of the nitride semiconductor layer 110 may be formed in a shape corresponding to that of the concave portion 112, for example, an inverse cone shape or an inverse multi-angle horn shape. Alternatively, the reflector 120 may be formed in other shapes, for example, a concave-convex shape or a rough shape. The shape of the reflector 120 may be modified.

Figure 11:
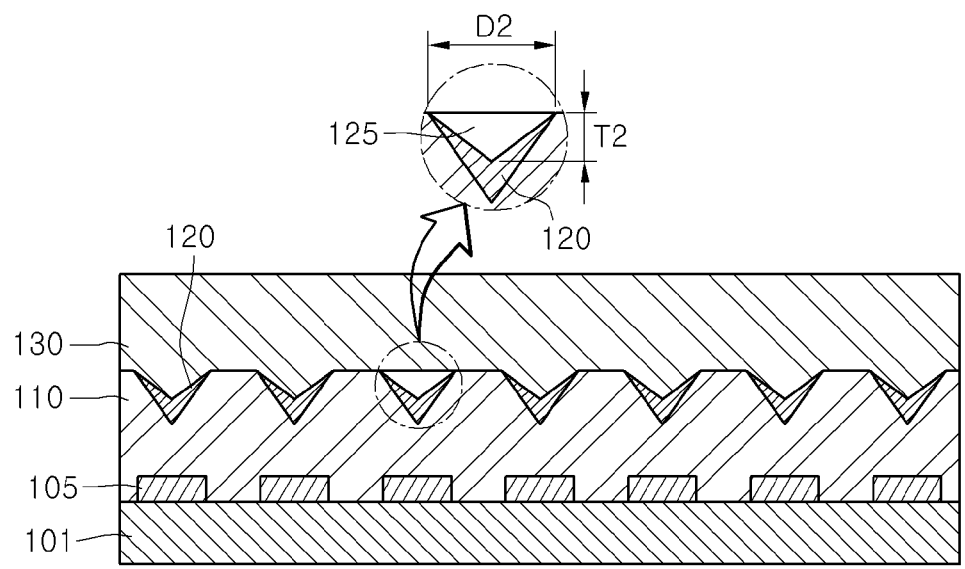

Referring to FIGS. 9 and 11, the first conductive semiconductor layer 130 may be formed on the nitride semiconductor layer 110. The first conductive semiconductor layer 130 may be formed of at least one of the compound semiconductors of group III-V elements (on which a first conductive dopant is doped), for example, GaN, AlN, AlGaN, InGaN, InN, InAlGaN and AlInN. In a case where the first conductive semiconductor layer 130 is an N-type semiconductor layer, the first conductive dopant comprises an N-type dopant such as Si, Ge, Sn, Se and Te.

In a case where the growth temperature of the first conductive semiconductor layer 130 can gradually increase, a lateral growth may be promoted and a flat top may be formed, but is not limited thereto.

Herein, the first conductive semiconductor layer 130 may be formed on the reflectors 120. At this point, the cavity 125 which is not filled with the first conductive semiconductor layer 130 may be formed in at least one of the reflectors 120. The cavity 125 may be formed with a sealed structure between the reflector 120 and the first conductive semiconductor layer 130. In the size of the cavity 125, a diameter D2 may be formed to about 0.01 um to 10 um, and a depth T2 may be formed to about 0.01 um to 10 um.

The shape of the cavity 125 may be formed in an inverse horn shape such as an inverse cone shape or an inverse multi-angle horn shape, or may be formed in a constant or random shape.

Herein, the reflectors 120, the cavities 125 and the first conductive semiconductor layer 130 are disposed with different mediums, and thus, the reflectors 120 and the cavities 125 may reflect, refract and diffuse light which is incident through the first conductive semiconductor layer 130.

The refraction index of the first conductive semiconductor layer 130 is about 2.12 to 2.44, and the refraction index of the cavity 125 is about 1. When the reflector 120 is formed of $SiO_2$, its refraction index is about 1.544 to 1.553. By reflecting light incident to the mediums, the critical angle of traveling light can be changed. Moreover, the cavity 125 and the reflector 120 decrease the internal total reflection rate of light, thereby improving light extraction efficiency.

Figure 12:
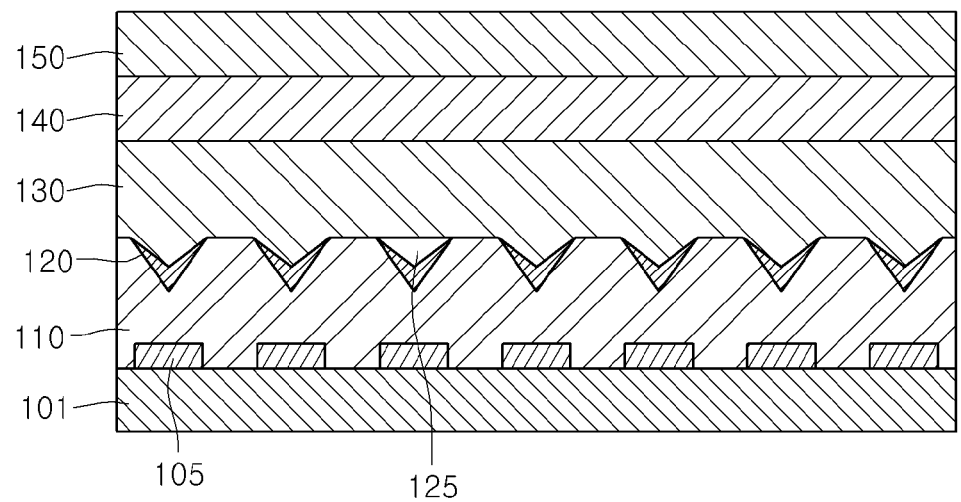

Referring to FIG. 12, the active layer 140 may be formed on the first conductive semiconductor layer 130. The active layer 140 is formed in a single quantum well structure or a multiple quantum well structure. The active layer 140 may comprise a material that emits a chromatic light such as a light having a blue wavelength, a light having a red wavelength and a light having a green wavelength. A conductive clad layer may be formed on or/and under the active layer 140, and the conductive clad layer may be formed in an AlGaN-based semiconductor.

The second conductive semiconductor layer 150 is formed on the active layer 140. The second conductive semiconductor layer 150 may be formed of at least one of the compound semiconductors of group III-V elements (on which a second conductive dopant is doped), for example, GaN, AlN, AlGaN, InGaN, InN, InAlGaN and AlInN. In a case where the second conductive semiconductor layer 150 is a P-type semiconductor layer, the second conductive dopant may comprise a P-type dopant such as Mg and Ze.

The third conductive semiconductor layer, for example, an N-type semiconductor layer or a P-type semiconductor layer, may be formed on the second conductive semiconductor layer 150. Accordingly, a light emitting structure may comprise at least one of an N-P junction structure, a P-N junction structure, an N-P-N junction structure and a P-N-P junction structure.

Figure 13:
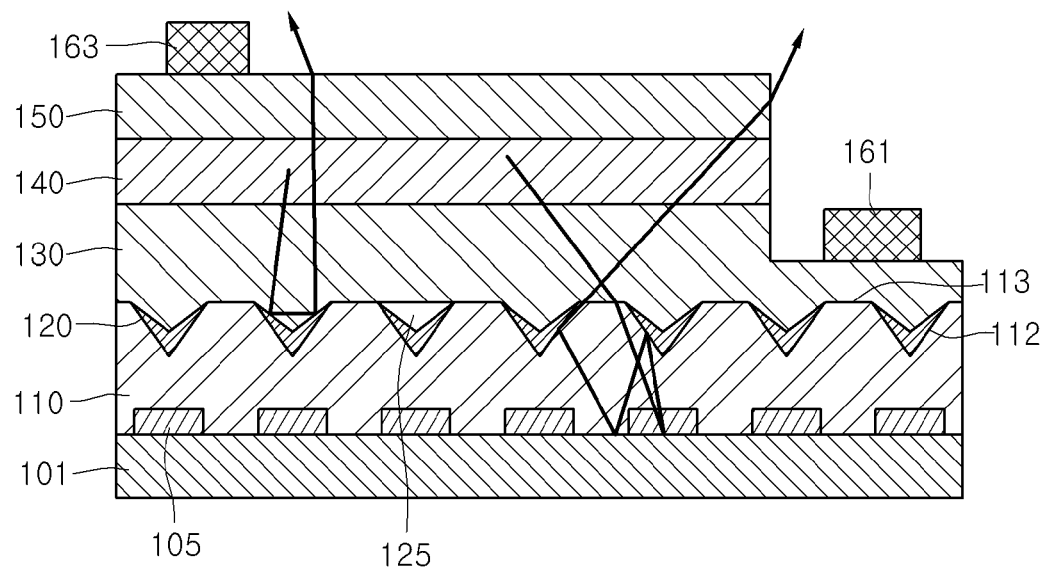

Referring to FIGS. 12 and 13, a mesa etching process is performed. The mesa etching process is performed until the first conductive semiconductor layer 130 is exposed. The first electrode 161 may be formed on the first conductive semiconductor layer 130, and the second electrode 163 may be formed on the second conductive semiconductor layer 150.

Herein, an electrode layer (not shown) may be formed on the second conductive semiconductor layer 150. The electrode layer may be formed before or after the mesa etching process, and may be formed as a transparent electrode layer or a reflection electrode layer. The transparent electrode layer may be formed of at least one of ITO, ZnO, RuOx, TiOx and IrOx, and the reflection electrode layer may be formed of at least one of Al, Ag, Pd, Rh, Pt and Ir. The second electrode 163 may electrically contact the second conductive semiconductor layer 150 and/or the electrode layer.

The second electrode 163 or the electrode layer (not shown)/second electrode may be defined as a second electrode portion. Moreover, the surfaces of the second conductive semiconductor layer 150 and the electrode layer may be formed in a roughness shape, but is not limited thereto.

Figure 14:
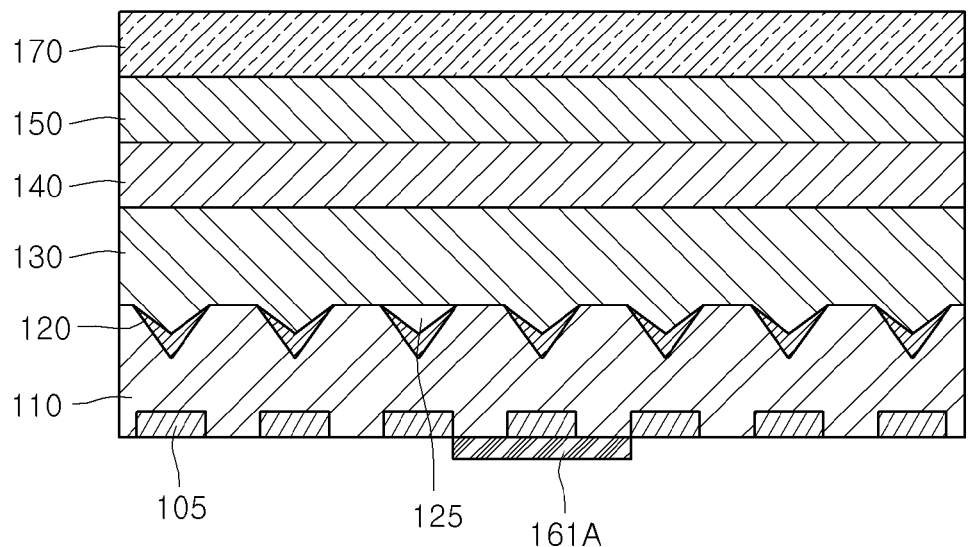
FIG. 14 is a diagram illustrating a semiconductor light emitting device according to a second embodiment.

FIG. 14 is a diagram illustrating a semiconductor light emitting device according to a second embodiment. In description of the second embodiment, repetitive description on the same elements as those of the first embodiment will be omitted and refers to that of the first embodiment.

Referring to FIG. 14, a semiconductor light emitting device 100A according to the second embodiment comprises a first conductive nitride semiconductor layer 110, a first electrode 161A, the reflector 120, the cavity 125, the first conductive semiconductor layer 130, the active layer 140, the second conductive semiconductor layer 150, and a second electrode portion 170.

The second electrode portion 170 is formed on the second conductive semiconductor layer 150, and comprises the stacked structure of a conductive support member and a reflection electrode layer (not shown). The reflection electrode layer is formed on the second conductive semiconductor layer 150, and may be formed of at least one of Al, Ag, Pd, Rh, Pt and Ir. The conductive support member may be formed of at least one of copper, gold and carrier wafer (for example, Si, Ge, GaAs, ZnO, SiC and the like) on the reflection electrode layer.

Herein, the substrate 101 is removed from the structure of FIG. 12. The substrate 101 may be removed in a physical/chemical process. The physical process, for example, may remove the substrate 101 in a Laser Lift Off (LLO) process using a laser.

When the substrate 101 is removed, the island pattern 105 may be removed or not.

Furthermore, the first electrode 161A is formed under the nitride semiconductor layer 110. The nitride semiconductor layer 110 is a semiconductor on which a first conductive dopant is doped, or may be implemented with the first conductive semiconductor layer 130. Accordingly, a power supply source which is injected through the first electrode 161A is transferred to the first conductive semiconductor layer 130 through the nitride semiconductor layer 110.

Light which is radiated from the active layer 140 is reflected by the electrode member 170, and the reflector 120 and/or the cavity 125 reflects, refracts and diffuses the light, thereby changing the critical angle of the light.

FIGS. 15 to 21 are diagrams illustrating a semiconductor light emitting device according to a third embodiment. In description of the third embodiment, repetitive description on the same elements as those of the first embodiment will be omitted and refers to that of the first embodiment.

Figure 15:
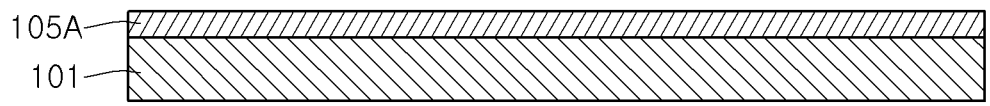
FIGS. 15 to 21 are diagrams illustrating a semiconductor light emitting device according to a third embodiment.
Figure 16:
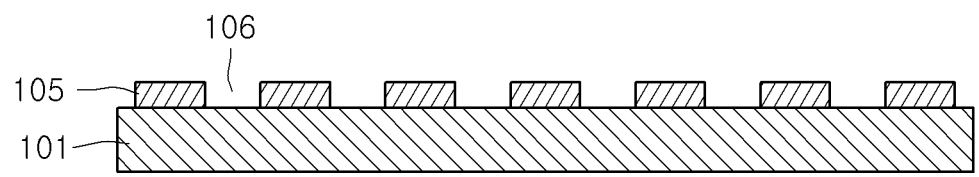

Referring to FIGS. 15 and 16, a mask layer 105A is formed on the substrate 101. The mask layer 105A may be formed by selectively using photomask materials such as $SiO_2$, $SiO_x$, $SiN_x$, $SiO_xN_y$ and metal materials, or may be formed of at least one of compound semiconductor materials such as GaN, InN, AlN, InGaN, AlGaN and InAlGaN. However, the materials may be changed in the spirit and scope of embodiments.

The mask layer 105A may be formed in the island pattern 105 having the window 106 by an etching process using a certain mask pattern. In the island pattern 105, an island having a circle or polygon shape may be formed at regular intervals or irregular intervals. Such an island shape and pattern may be modified in the spirit and scope of embodiments.

Figure 17:
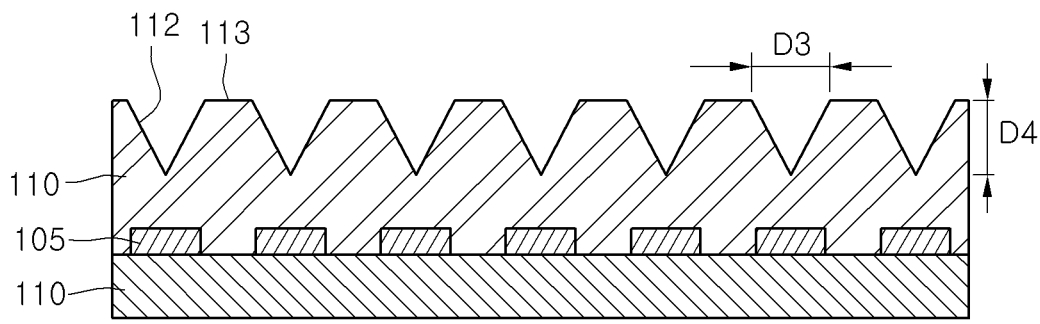

Referring to FIGS. 16 and 17, the nitride semiconductor layer 110 is formed on the substrate 101 and the island pattern 105. When the nitride semiconductor layer 110 is GaN, it may be formed in CVD (or MOCVD). For example, the nitride semiconductor layer 110 may use a group-III gas such as trimethyl gallium (TMGa) or triethyl gallium (TEGa) as a source gas for Ga, and may use a group-V gas such as ammonia ($NH_3$), monomethyl hydrazine (MMHy) or dimethyl hydrazine (DMHy) as a source gas for N.

By controlling growth conditions such as a growth temperature, a group-V gas to group-III gas ratio and a growth pressure, the nitride semiconductor layer 110 may grow. In this case, the nitride semiconductor layer 110 grows from the top of the substrate 101 at the initial stage of growth. As a growth time elapses, the nitride semiconductor layer 110 grows to the top of the island pattern 105. At this point, the nitride semiconductor layer 110 may be sutured or may not be sutured on the island pattern 105, but is not limited thereto.

A region corresponding to the island pattern 105 is the concave portion 112 of the nitride semiconductor layer 110, and a region other than the concave portion 112 is the convex portion 113 of the nitride semiconductor layer 110.

The nitride semiconductor layer 110 may be selected from the group consisting of GaN, InN, AlN, InGaN, AlGaN and InAlGaN. Moreover, the nitride semiconductor layer 110 may be implemented with a semiconductor layer on which a conductive dopant is doped or not. The concave portion 112 of the nitride semiconductor layer 110 may be formed in an inverse horn shape such as an inverse pyramid shape, an inverse multi-angle horn shape and an inverse cone shape. For example, the concave portion 112 of the nitride semiconductor layer 110 may be formed in the inverse pyramid shape by the crystallinity of a GaN-based semiconductor.

In the concave portion 112 of the nitride semiconductor layer 110, its diameter D3 and depth D4 may be formed by semiconductor crystallization, or may be formed in consideration of the size of the reflector 120. The concave portions 112 of the nitride semiconductor layer 110 may be formed at constant intervals and of a conformal size, or may be formed at irregular intervals and of a random size.

Figure 18:
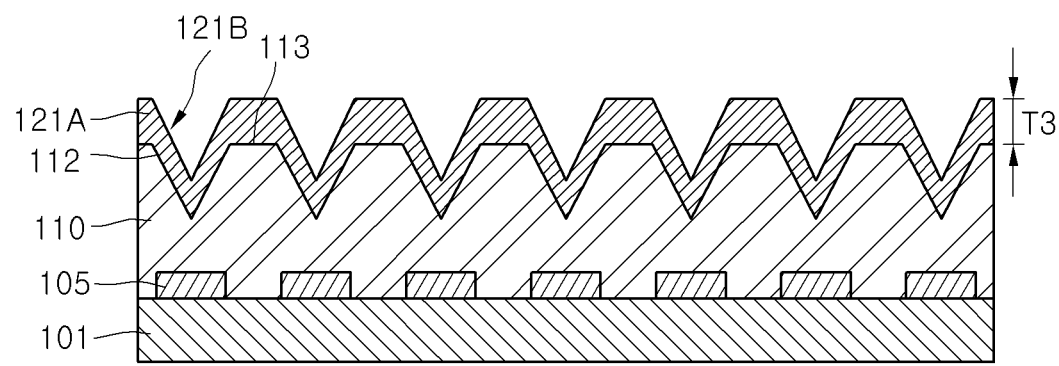

Referring to FIGS. 17 and 18, a reflector layer 121A is formed on the nitride semiconductor layer 110. The reflector layer 121A may be formed in a single layer or multi layers. The reflector layer 121A may be formed of at least one of the reflection material group consisting of SiO, SiO, $SiN_2$, $SiN_x$, $SiO_xN_y$, or metal materials (for example, tungsten). The reflector layer 121A may be formed in two or more layers by selectively using the semiconductor group consisting of GaN, InN, AlN, InGaN, AlGaN or InAlGaN and the reflection material group.

The reflector layer 121A may be formed to a certain thickness T3 along the concave portion 112 and convex portion 113 of the nitride semiconductor layer 110. Herein, the depth of the groove 121B of the reflector layer 121A may be formed to the region of the concave portion 112 of the nitride semiconductor layer 110.

The shape of the groove 121B of the reflector layer 121A may be formed in a shape corresponding to the concave portion 112 of the nitride semiconductor layer 110.

Figure 19:
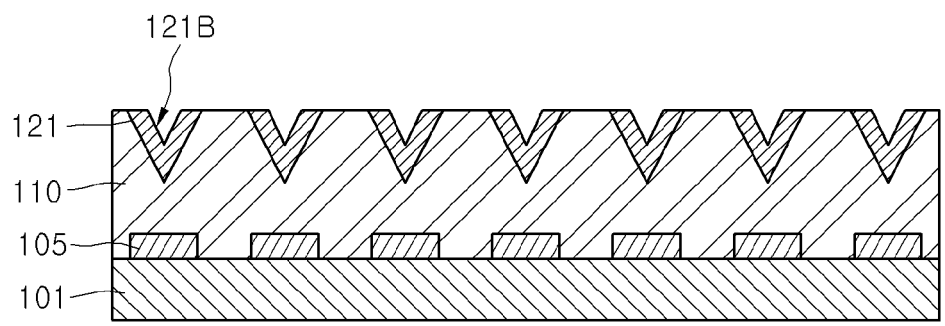

Referring to FIGS. 18 and 19, the certain thickness T3 of the reflector layer 121A is removed. The reflector layer 121A is removed until the convex portion 113 of the nitride semiconductor layer 110 is exposed. The removing process is performed in a polishing process, a selective etching process or an etching process next to the polishing process. If the reflector layer 121A is polished to the certain thickness T3, as illustrated in FIG. 19, a plurality of reflectors 121 exist in the concave portions 112 of the nitride semiconductor layer 110, respectively. The plurality of reflectors 121 may be discontinuously arranged.

The reflector 121 may be formed in a concave-convex shape (for example, a cross-sectional surface having a V shape) by the concave shape of the reflector layer 120A. That is, the reflector 121 has an inverse multi-angle horn shape, and a groove 121B having a concave shape may be formed in the inside of the reflector 120. The groove 121B of the reflector 121 may be formed to have a width narrower than that of the groove 120B of the reflector 120 according to the first embodiment, and may be formed to have a depth deeper than that of the groove 120B of the reflector 120 according to the first embodiment.

Figure 20:
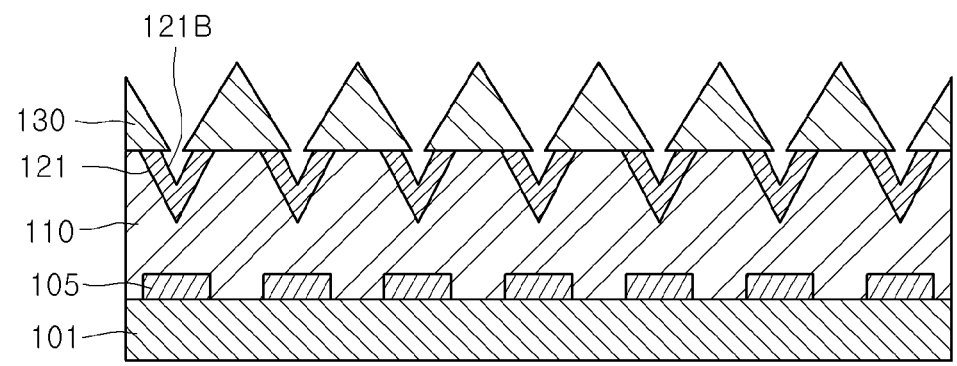
Figure 21:
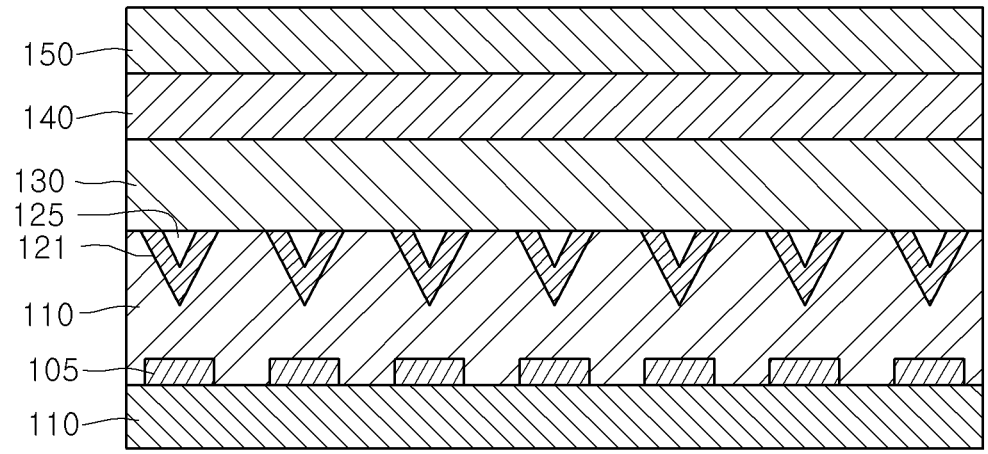

Referring to FIGS. 19 to 21, the first conductive semiconductor layer 130 is formed on the nitride semiconductor layer 110. The first conductive semiconductor layer 130 grows through the nitride semiconductor layer 110. In the growth of the first conductive semiconductor layer 130, a lateral growth is promoted as a growth time elapses, and thus it is extended and grown to the top of the reflector 121. The first conductive semiconductor layer 130 may be sutured on the reflector 121, and the region of the groove 121B of the reflector 121 may be formed as the cavity 125 as illustrated in FIG. 21. The cavity 125 may be formed in the each reflector 121, but is limited thereto.

The active layer 140 and the second conductive semiconductor layer 150 may be formed on the first conductive semiconductor layer 130. The first conductive semiconductor layer 130, the active layer 140 and the second conductive semiconductor layer 150 refer to the first embodiment.

In the semiconductor light emitting device 100B, the cavity 125 is formed in each of the plurality of reflectors 121. Accordingly, the reflectors 121, the cavities 125 and the first conductive semiconductor layer 130 may reflect, refract and diffuse light, thereby improving the light extraction efficiency of the semiconductor light emitting device 100B.

The semiconductor light emitting device 100B may be manufactured as the lateral semiconductor light emitting device of FIG. 13, or may be manufactured as the vertical semiconductor light emitting device of FIG. 14.

FIGS. 22 to 28 are diagrams illustrating a process of manufacturing a semiconductor light emitting device according to a fourth embodiment. In description of the fourth embodiment, repetitive description on the same elements as those of the first embodiment will be omitted and refers to that of the first embodiment.

Figure 22:
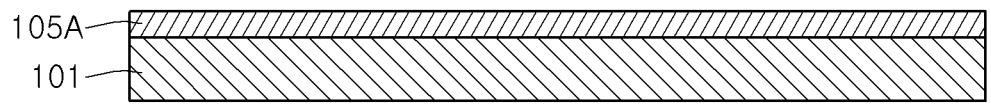
FIGS. 22 to 28 are diagrams illustrating a process of manufacturing a semiconductor light emitting device according to a fourth embodiment.
Figure 23:
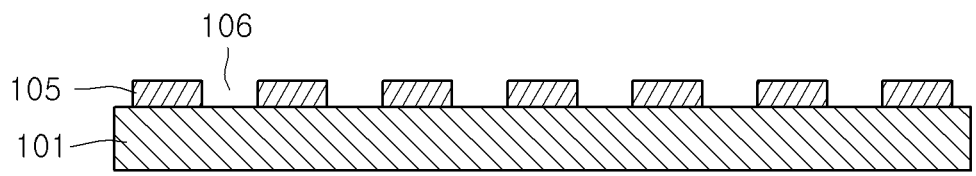

Referring to FIGS. 22 and 23, the mask layer 105A is formed on the substrate 101. The mask layer 105A may be formed by selectively using photomask materials such as $SiO_2$, $SiO_x$, $SiN_x$, $SiO_xN_y$ and metal materials, or may be formed of at least one of compound semiconductor materials such as GaN, InN, AlN, InGaN, AlGaN and InAlGaN. However, the materials may be changed in the spirit and scope of embodiments.

The mask layer 105A may be formed in the island pattern 105 having the window 106 by an etching process using a certain mask pattern. In the island pattern 105, an island having a circle or polygon shape may be formed at regular intervals or irregular intervals. Such an island shape and pattern may be modified in the spirit and scope of embodiments.

Figure 24:
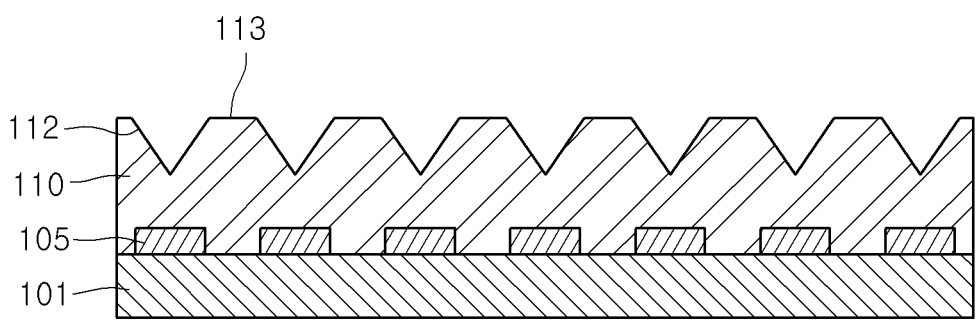

Referring to FIGS. 23 and 24, the nitride semiconductor layer 110 is formed on the substrate 101 and the island pattern 105. By controlling growth conditions such as a growth temperature, a group-V gas to group-III gas ratio and a growth pressure, the nitride semiconductor layer 110 may grow. In this case, the nitride semiconductor layer 110 grows from the top of the substrate 101 at the initial stage of growth. As a growth time elapses, the nitride semiconductor layer 110 grows to the top of the island pattern 105. At this point, the nitride semiconductor layer 110 may be sutured or may not be sutured on the island pattern 105, but is not limited thereto.

A region corresponding to the island pattern 105 is the concave portion 112 of the nitride semiconductor layer 110, and a region other than the concave portion 112 is the convex portion 113 of the nitride semiconductor layer 110.

The nitride semiconductor layer 110 may be selected from the group consisting of GaN, InN, AlN, InGaN, AlGaN and InAlGaN. Moreover, the nitride semiconductor layer 110 may be implemented with a semiconductor layer on which a conductive dopant is doped or not. The concave portion 112 of the nitride semiconductor layer 110 may be formed in an inverse horn shape such as an inverse pyramid shape, an inverse multi-angle horn shape and an inverse cone shape. Moreover, the concave portions 112 of the nitride semiconductor layer 110 may be formed at constant intervals and of a conformal size, or may be formed at irregular intervals and of a random size.

Figure 25:
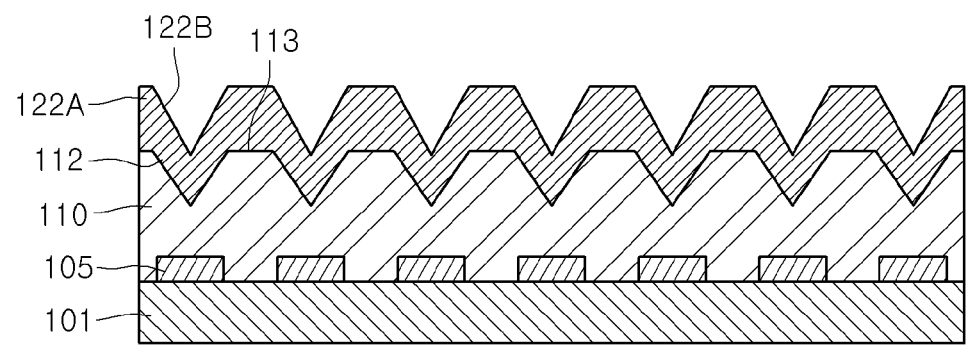

Referring to FIGS. 24 and 25, a reflector layer 122A is formed on the nitride semiconductor layer 110. The reflector layer 122A may be formed in a single layer or multi layers. The reflector layer 122A may be formed of at least one of the reflection material group consisting of $SiO_2$, SiO, $SiN_2$, $SiN_x$, $SiO_xN_y$, or metal materials (for example, tungsten). The reflector layer 122A may be formed in two or more layers by selectively using the semiconductor group consisting of GaN, InN, AlN, InGaN, AlGaN or InAlGaN and the reflection material group.

The reflector layer 122A may be formed to a certain thickness along the concave portion 112 and convex portion 113 of the nitride semiconductor layer 110. Herein, the depth of the groove 122B of the reflector layer 122A may be formed to the extended line of the concave portion 112 of the nitride semiconductor layer 110.

The shape of the groove 122B of the reflector layer 122A may be formed in a shape corresponding to the concave portion 112 of the nitride semiconductor layer 110.

Figure 26:
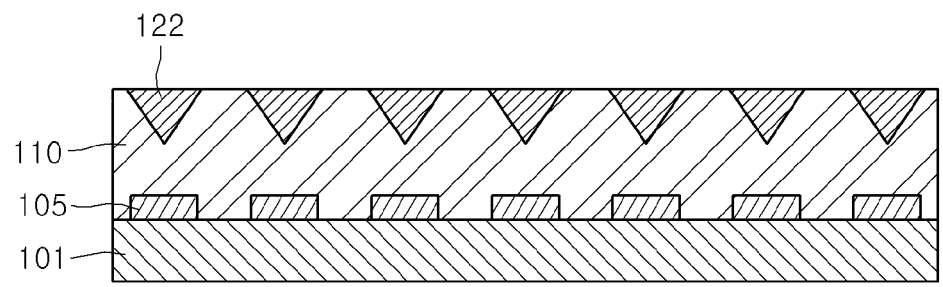

Referring to FIGS. 25 and 26, the reflector layer 122A is removed until the top of the nitride semiconductor layer 110 is exposed. The removing process is performed in a polishing process, a selective etching process or an etching process next to the polishing process. If the reflector layer 122A is polished, as illustrated in FIG. 26, a plurality of reflectors 122 exist in the concave portions 112 of the nitride semiconductor layer 110, respectively. The plurality of reflectors 122 are discontinuously arranged in a structure.

The reflector 122 may be formed in an inverse multi-angle horn shape with no internal concave groove. The top of the reflector 122 and the top of the nitride semiconductor layer 110 may be on the same straight line.

Figure 27:
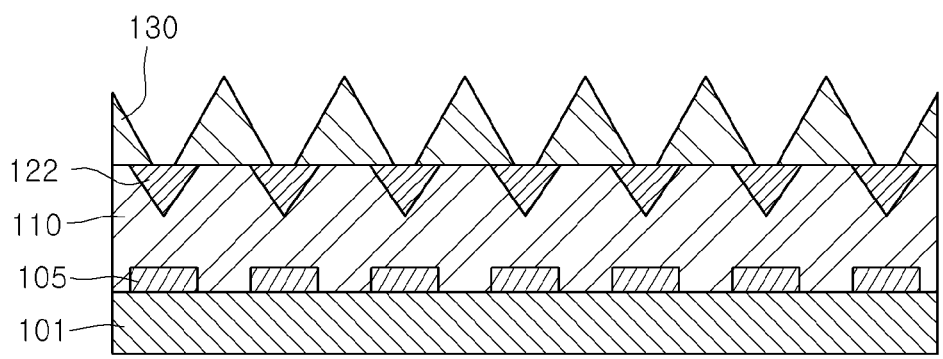
Figure 28:
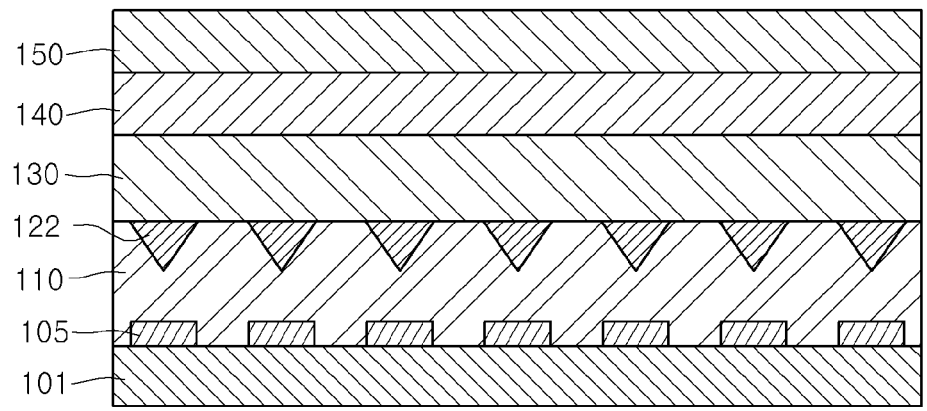

Referring to FIGS. 27 and 28, the first conductive semiconductor layer 130 is formed on the nitride semiconductor layer 110. The first conductive semiconductor layer 130 grows through the nitride semiconductor layer 110. As a growth time elapses, the first conductive semiconductor layer 130 is extended and grown to the top of the reflector 122. Subsequently, a lateral growth is promoted by controlling the growth temperature of the nitride semiconductor layer 110, and thus, the first conductive semiconductor layer 130 is sutured with the reflector 121 so that a flat top may be formed. Herein, a cavity may not be formed between the reflector 122 and the first conductive semiconductor layer 130.

The active layer 140 and the second conductive semiconductor layer 150 may be formed on the first conductive semiconductor layer 130. The first conductive semiconductor layer 130, the active layer 140 and the second conductive semiconductor layer 150 refer to the first embodiment.

A semiconductor light emitting device 100C according to the fourth embodiment may reflect, refract and diffuse light by the plurality of reflectors 122 and the first conductive semiconductor layer 130, thereby improving light extraction efficiency thereof.

The semiconductor light emitting device 100C may be manufactured as the lateral semiconductor light emitting device of FIG. 13, or may be manufactured as the vertical semiconductor light emitting device of FIG. 14.

Figure 29:
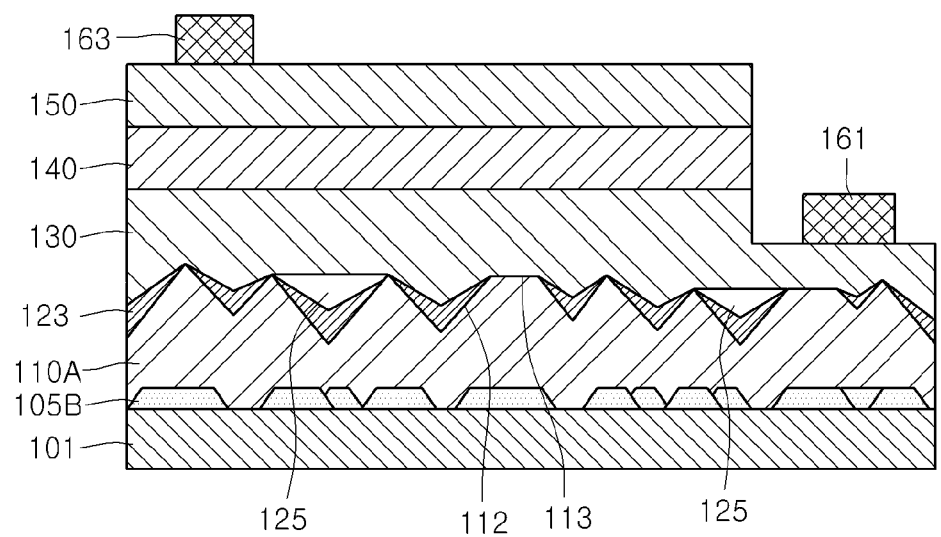
FIG. 29 is a side-sectional view of a semiconductor light emitting device according to a fifth embodiment.

FIG. 29 is a side-sectional view of a semiconductor light emitting device according to a fifth embodiment. In description of the fifth embodiment, repetitive description on the same elements as those of the first embodiment will be omitted and refers to that of the first embodiment.

Referring to FIG. 29, a semiconductor light emitting device 100D according to the fifth embodiment comprises an island pattern 105B formed of irregular sizes and at irregular intervals on the substrate 110.

The island pattern 105B is formed in an island shape by controlling the thin-film growth conditions of a compound semiconductor. The island pattern 105B may be selected from the group consisting of GaN, InN, AlN, InGaN, AlGaN and InAlGaN, but is not limited thereto.

The island pattern 105B, for example, may be formed in an island shape by using a GaN crystal having a hexagonal crystal structure on the substrate 101. The island shape of the island pattern 105B may be formed to have a cross-sectional surface of a trapezoid shape and a random size.

The following description will be made in detail on a process of manufacturing the island pattern 105B.

First, a growth temperature is controlled at an initial temperature (C1) of a first stage in the reaction chamber of growth equipment (for example, MOCVD), and the GaN seed layer of a compound semiconductor grows by providing an atmosphere gas, a Ga source gas and an N source gas. Herein, the GaN seed layer may be formed as a GaN buffer layer or a GaN core formation layer.

Subsequently, the growth temperature increases at the growth temperature (C2) of a second stage, and thus, the GaN seed layer grows in an island shape. In the island pattern 105B, for example, a GaN semiconductor seed may grow for three minutes at 530° C. in the first stage, and may grow for one minute at 1050° C. in the second stage. Herein, hydrogen ($H_2$) and nitrogen ($N_2$) are provided as the atmosphere gas, ammonia ($NH_3$) is provided as the N source gas, and trimethyl gallium (TMGa) is provided as the Ga source gas. The growth temperature (C1) of the first stage is about 300° C. to 900° C., and the growth temperature (C2) of the second stage is about 700° C. to 1200° C.

Moreover, the island pattern 105B may grow in such a form that a lateral surface parallel to the surface of the substrate 101 does not almost exist.

In the growth of the island pattern 105B, the growth temperatures (C1 and C2) may be changed at several stages with time, and may be continuously changed from the growth temperature (C1) of the first stage to the growth temperature (C2) of the second stage with time. Alternatively, the growth of the island pattern 105B is separately performed at several sections. In this case, the growth stops and an annealing process may be performed between the respective sections, or the growth temperature of the each section may be maintained for a certain time. Alternatively, the growth temperature may increase/decrease and the press of the reaction chamber may be controlled under growth. In addition, by controlling the change of the growth temperature with time, a semiconductor having irregular three-dimensional island shapes may be formed.

The island pattern 105B may be formed to a thickness of 100 Å to 1 um, and may serve as a buffer layer on the substrate 101.

A nitride semiconductor layer 110A is formed on the island pattern 105B. The nitride semiconductor layer 110A grows on the island shape of the island pattern 105B, and thus, its surface may be formed in the shapes of the concave portion 112 and the convex portion 113. The nitride semiconductor layer 110A may be selected from the group consisting of GaN, InN, AlN, InGaN, AlGaN and InAlGaN, and may also be formed as a semiconductor layer on which a conductive dopant is doped or an undoped semiconductor layer on which the conductive dopant is not doped.

The concave portions 112 of the nitride semiconductor layer 110A may be formed of a non-conformal size and at irregular intervals due to the non-conformal size or irregular arrangement of the island pattern 105B.

A plurality of reflectors 123 are formed on the concave portions 112 of the nitride semiconductor layer 110A respectively, and may be formed of a non-conformal size and in a non-conformal shape. The cavity 125 may be formed in at least one of the reflectors 123. Herein, the plurality of cavities 125 may differ from one another according to the sizes of the respective reflectors 123.

The lateral structure of the semiconductor light emitting device 100D has been described above, but the semiconductor light emitting device 100D may be manufactured in a vertical structure.

The semiconductor light emitting device 100D can improve light extraction efficiency by the non-conformal sizes of the reflectors 123 and the cavities 125.

Figure 30:
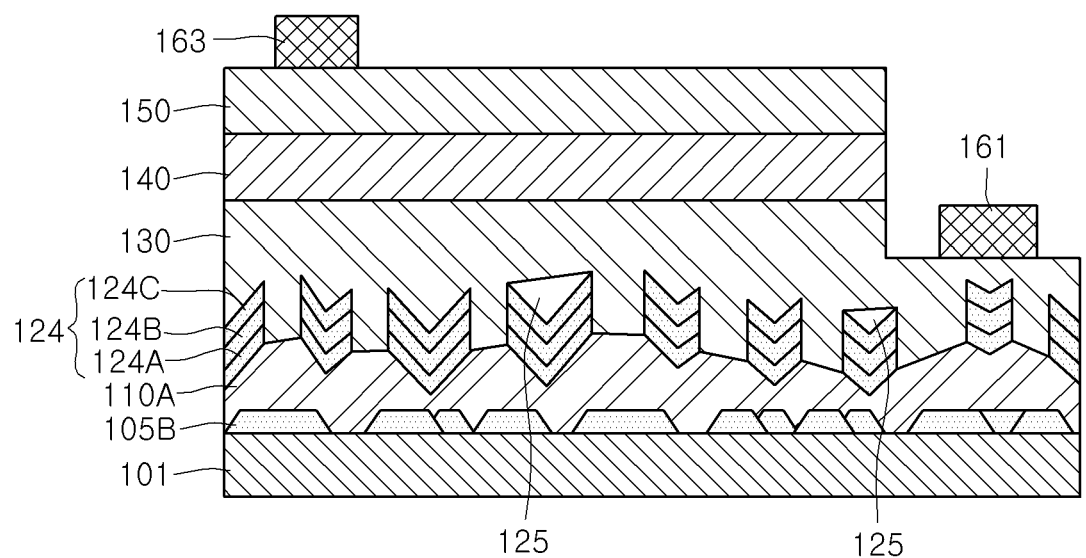
FIG. 30 is a diagram illustrating a semiconductor light emitting device according to a sixth embodiment.

FIG. 30 is a diagram illustrating a semiconductor light emitting device according to a sixth embodiment. In description of the sixth embodiment, repetitive description on the same elements as those of the first and fifth embodiments will be omitted and refers to that of the first and fifth embodiments.

Referring to FIG. 30, a semiconductor light emitting device 100E according to the sixth embodiment comprises a plurality of reflectors 124 composed of multi-layer reflectors 124A, 124B and 124C.

The reflector 124 may be implemented as the multi-layer reflectors 124A, 124B and 124C on the each concave portion 112 of the nitride semiconductor layer 110A.

The first reflector 124A of the reflector 124 is stacked on the concave portion 112 of the nitride semiconductor layer 110A, the second reflector 124B is stacked on the first reflector 124A, and the third reflector 124C is stacked on the second reflector 124B.

In the reflector 124, the first and second reflectors 124A and 124B may be implemented as a pair or multi pairs. The first reflector 124A may be selected from the group consisting of $SiO_2$, $SiO_x$, $SiN_2$, $SiN_x$, $SiO_xN_y$ or metal materials (for example, tungsten). Herein, the first reflectors 124A may be discontinuously formed in a concave-convex structure having an inverse horn shape.

The second reflector 124B may be selected from the group consisting of GaN, InN, AlN, InGaN, AlGaN or InAlGaN, or may be selected from the group consisting of materials different from the first reflector 124A, for example, $SiO_2$, $SiO_x$, $SiN_2$, $SiN_x$, $SiO_xN_y$ or metal materials.

The uppermost third reflector 124C of the reflector 124 is formed of a first reflection material, or may be formed of a semiconductor different from the first conductive semiconductor layer 130. Moreover, the third reflector 124C may be formed in an arbitrary geometrical shape such as polyhedron and a curved figure instead of a layer shape, or may be formed of particles having a certain size. The reflector 124 may protrude to the inside of the first conductive semiconductor layer 130.

The reflector 124 grows as a reflector layer having a multi-layer structure. Subsequently, only the structure of the reflector 124 remains, and the reflector 124 is etched in a selective etching process (for example, a wet etching process and a dry etching process). The reflectors 124 may be discontinuously disposed in the etching process.

The multi-layer reflectors 124A, 124B and 124C may be implemented with at least one of a hetero-joined reflector, a periodically hetero-joined super lattice structure, a hetero reflector having no period and a Distributed-Bragg Reflector (DBR) structure.

At least one of the cavities 125 may be formed between the reflector 124 and the first conductive semiconductor layer 130. The first conductive semiconductor layer 130, the reflector 124 or/and the cavity 125 may effectively change the path of incident light. Although the lateral structure of the semiconductor light emitting device 100E has been described above, the semiconductor light emitting device 100E may be manufactured in a vertical structure, but is not limited thereto.

The structure of the reflector according to the above-disclosed embodiments may be formed in regular or irregular concave-convex shapes in the lower portion of the light emitting structure. Moreover, the cavity is formed in at least one of the plurality of reflectors, thereby reflecting, diffusing, diffracting or/and refracting light which travels by the refraction index and geometrical features of the reflector and the cavity. Accordingly, the total reflection rate of light may decrease and light extraction efficiency may be improved in the inside of the semiconductor light emitting device. Moreover, The technical characteristics of the above-disclosed embodiments are not limited thereto, and may be selectively applied to another embodiment.

Although the embodiment has been made in relation to the compound semiconductor light emitting device comprising the N-P junction structure as an example, the compound semiconductor light emitting device comprising an N-P-N structure, a P-N structure or a P-N-P structure can be implemented. In the description of the embodiment, it will be understood that, when a layer (or film), a region, a pattern, or a structure is referred to as being "on (above/over/upper)" or "under (below/down/lower)" another substrate, another layer (or film), another region, another pad, or another pattern, it can be directly on the other substrate, layer (or film), region, pad or pattern, or intervening layers may also be present. Furthermore, it will be understood that, when a layer (or film), a region, a pattern, a pad, or a structure is referred to as being "between" two layers (or films), regions, pads or patterns, it can be the only layer between the two layers (or films), regions, pads, or patterns or one or more intervening layers may also be present. Thus, it should be determined by technical idea of the invention.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
a first semiconductor layer comprising a flat top surface and a plurality of concaves;
a reflector within the plurality of concaves of the first semiconductor layer;
a second semiconductor layer on the first semiconductor layer;
a third semiconductor layer on the second semiconductor layer; and
an active layer between the second semiconductor layer and the third semiconductor layer,
wherein the reflector has a different material from the first semiconductor layer and the second semiconductor layer,
wherein the flat top surface of the first semiconductor layer is physically contacted with a lower surface of the second semiconductor layer and is disposed between the plurality of concaves,
wherein the plurality of concaves are spaced apart from each other and have an interval from a lower surface of the first semiconductor layer,
wherein the second semiconductor layer is formed of a conductive semiconductor layer doped with a dopant,
wherein the reflector is disposed between the first semiconductor layer and the second semiconductor layer, and
wherein a lower vertex point of the reflector is physically contacted with the first semiconductor layer.

2. The semiconductor light emitting device according to claim 1, wherein the reflector includes a silicon-based material.

3. The semiconductor light emitting device according to claim 1, wherein the reflector includes a metallic material or a metal oxide based material.

4. The semiconductor light emitting device according to claim 1, wherein at least one of the plurality of concaves has a periphery side of multi-angle shape with a lower vertex point.

5. The semiconductor light emitting device according to claim 1, wherein each of the plurality of concaves includes an upper portion having width wider than that of a lower portion.

6. The semiconductor light emitting device according to claim 5, wherein the reflector has a slope side with respect from the flat top surface of the first semiconductor layer.

7. The semiconductor light emitting device according to claim 1, further comprising a plurality of islands embedded in the lower surface of the first semiconductor layer,
wherein the plurality of islands are spaced apart from each other and have a different material from the first semiconductor layer, and
wherein the first semiconductor layer is disposed between the plurality of islands and the reflector.

8. The semiconductor light emitting device according to claim 7, wherein at least one of the plurality of islands are vertically overlapped with a portion of at least one of the plurality of concaves of the first semiconductor layer.

9. The semiconductor light emitting device according to claim 7, further comprising a substrate under the first semiconductor layer,
wherein the plurality of islands are disposed between the substrate and the first semiconductor layer.

10. The semiconductor light emitting device according to claim 7, wherein the plurality of islands comprises a metal oxide based material.

11. The semiconductor light emitting device according to claim 1, wherein a top region of at least one of the reflector has a recess between the reflector and the second semiconductor layer,
wherein the recess of the reflector is located lower than the flat top surface of the first semiconductor layer.

12. The semiconductor light emitting device according to claim 1, wherein the first semiconductor layer comprises a group III-V compound semiconductor which is not doped with a conductive dopant.

13. The semiconductor light emitting device according to claim 1, wherein the plurality of concaves have regular intervals.

14. A semiconductor light emitting device, comprising:
a first semiconductor layer comprising a flat top surface and a plurality of concaves;
a second semiconductor layer disposed on the first semiconductor layer and including a first conductive type dopant;
a reflector within the plurality of concaves;
a first electrode connected to the second semiconductor layer;
a third semiconductor layer disposed on the second semiconductor layer and including a second conductive type dopant;
an active layer between the second semiconductor layer and the third semiconductor layer;
an electrode layer on the third semiconductor layer,
wherein the reflector has a different material from the first semiconductor layer and the second semiconductor layer,
wherein the reflector is disposed between the first semiconductor layer and the second semiconductor layer,
wherein the flat top surface of the first semiconductor layer is disposed between the plurality of concaves,
wherein the second semiconductor layer is formed of a conductive nitride-based semiconductor layer doped with a dopant,
wherein the reflector is disposed between the first semiconductor layer and the second semiconductor layer,
wherein at least one of the plurality of concaves has a polyhedron shape with a lower vertex point,
wherein a lower vertex point of the reflector is physically contacted with the first semiconductor layer, and
wherein the second semiconductor layer is physically contacted with the first semiconductor layer and is electrically connected to the first electrode.

15. The semiconductor light emitting device according to claim 14, wherein at least one of the plurality of concaves includes an upper portion of pyramid shape.

16. The semiconductor light emitting device according to claim 14, comprising at least one cavity between the reflector and the second semiconductor layer,
wherein the cavity includes a medium having a refraction index smaller than that of the reflector.

17. The semiconductor light emitting device according to claim 14, wherein the reflector includes the material having a refraction index smaller than that of the first semiconductor layer and the second semiconductor layer.

18. The semiconductor light emitting device according to claim 14, further comprising an island corresponding to the plurality of concaves and disposed on the first semiconductor layer,
wherein the island has a different material from the first semiconductor layer, and
wherein the first semiconductor layer is disposed between the island and the reflector.

19. The semiconductor light emitting device according to claim 14, wherein the reflector comprises at least one of $SiO_2$, $SiO_x$, $SiN_x$, $SiO_xN_y$, a metal material and a group III-V compound semiconductor.

20. A semiconductor light emitting device, comprising:
a first semiconductor layer comprising a flat top surface region and a concave regions;
a reflector within the concave regions of the first semiconductor layer;
a second semiconductor layer on the first semiconductor layer;
a third semiconductor layer on the second semiconductor layer; and
an active layer between the second semiconductor layer and the third semiconductor layer,
wherein the reflector has a different material from the first semiconductor layer and the second semiconductor layer,
wherein the flat top surface region of the first semiconductor layer is physically contacted with a lower surface of the second semiconductor layer,
wherein the concave region has at least two concaves and a position of the concaves is positioned less high than the flat top surface region from a lower surface of the first semiconductor layer,
wherein the second semiconductor layer is formed of a conductive semiconductor layer doped with a dopant,
wherein the reflector is disposed between the first semiconductor layer and the second semiconductor layer,
wherein at least one of the plurality of concaves has a polyhedron shape with a lower vertex point, and
wherein a lower vertex point of the reflector is physically contacted with the first semiconductor layer.

* * * * *